US010863128B2

(12) United States Patent
Magnani (10) Patent No.: US 10,863,128 B2
(45) Date of Patent: Dec. 8, 2020

(54) RCCC TO MONOCHROME INTERPOLATOR (71) Applicant: BAE SYSTEMS Information and Electronic Systems Integration Inc., Nashua, NH (US)

(72) Inventor: Alberto M Magnani, Danville, CA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 82 days.

(21) Appl. No.: 16/247,643

(22) Filed: Jan. 15, 2019

(65) Prior Publication Data
US 2020/0228742 A1 Jul. 16, 2020

(51) Int. Cl.
H04N 5/3745 (2011.01)
H04N 9/04 (2006.01)
H01L 27/146 (2006.01)

(52) U.S. Cl.
CPC ..... *H04N 5/3745* (2013.01); *H01L 27/14621* (2013.01); *H04N 9/045* (2013.01)

(58) Field of Classification Search
CPC ........... H01L 27/14621; H04N 2209/045-046; G06T 3/4015
USPC .......................... 348/273-283; 356/419, 356
See application file for complete search history.

(56) References Cited

U.S. PATENT DOCUMENTS

| 2004/0028271 | A1* | 2/2004 | Pollard | H04N 9/045 382/162 |
| 2007/0024934 | A1* | 2/2007 | Andams, Jr. | H04N 9/04555 358/525 |
| 2007/0159542 | A1* | 7/2007 | Luo | H04N 9/04557 348/272 |
| 2016/0080626 | A1* | 3/2016 | Kovtun | H04N 5/2355 348/218.1 |
| 2018/0188427 | A1* | 7/2018 | Brueckner | G02B 5/201 |

OTHER PUBLICATIONS

Gopal Karanam, Interfacing Red/Clear Sensors to ADSP-BF609@BlackfinProcessors, May 28, 2013, Engineer-to Engineer Note EE-358, 4 pages.*

(Continued)

*Primary Examiner* — Xi Wang
(74) *Attorney, Agent, or Firm* — Maine Cernota & Rardin; Scott J. Asmus (57) ABSTRACT A system produces an interpolated luminance-balanced monochrome image from a Red-Clear-Clear-Clear (RCCC) pattern image. It may include an imager having a RCCC pattern filter array. There is an interpolation processing module with one or more processors processing sampled, red filtered image pixels. A red plane is interpolated using the sampled, red filtered pixels, producing an interpolated red for the pixels. The interpolated red pixels are subtracted from the sampled clear pixels, producing a "Clear minus Red" ("C–R") plane. A C–R value is interpolated for the red filtered pixels. The interpolated C–R value is added to the sampled red pixels, and the monochrome image is output, where the luminance is balanced across the pixels, especially in low and very light environments.

20 Claims, 5 Drawing Sheets

HIGH LEVEL FLOW CHART (56) References Cited

OTHER PUBLICATIONS

Karanam, G, "Interfacing Red/Clear Sensor to ADSP-BF609 Blackfin Processors", Analog Devices Engineer-to-Engineer Note EE-358; Publication [online]. May 28, 2013 [retrieved Mar. 4, 2020]. Retrieved from the Internet: <URL: https://www.analog.com/media/en/technical-documentation/application-notes/EE358.pdf>; pp. 1-4.

* cited by examiner

PRIOR ART GRBG IMAGE
FIG. 1

HIGH LEVEL FLOW CHART
FIG. 2

DETAIL FLOW CHART
STEP 210 INTERPOLATING A RED PLANE USING SAMPLED, RED FILTERED PIXELS,
PRODUCING AN INTERPOLATED RED FOR EVERY PIXEL
FIG. 3

DETAIL FLOW CHART
STEP 220 INTERPOLATING A C-R VALUE FOR EACH RED FILTERED PIXEL
FIG. 4

C-R PLANE
FIG. 5

RCCC TO MONOCHROME INTERPOLATOR

FIELD OF THE DISCLOSURE

This disclosure relates to processing sensor images, particularly, Red-Clear-Clear-Clear (RCCC) to monochrome image processing.

BACKGROUND

Image sensors have been using the classic "Bayer" pattern (Green-Red-Blue-Green "GRBG", also called BGGR, RGBG, GRGB, or RGGB) color filter array for decades to obtain color information from a single, monolithic, 2-dimensional array of photodiodes. Recently, with automotive sensing applications, a new pattern of Red-Clear-Clear-Clear (RCCC) has become an alternative to the Green-Red-Blue-Green pattern to help solve the color discrimination between roadway markings in white and in yellow. Oftentimes, a monochrome option is not available, and an interpolation has to take place to get a monochrome image where the luminance is balanced across all pixels.

Luminance is a photometric measure of the luminous intensity per unit area of light travelling in a given direction. Luminance indicates how much luminous power will be detected by an eye looking at the surface from a particular angle. Luminance balance can be represented as the minimum luminance divided by the average luminance ($L_{min}/L_{ave}$). Unbalanced luminance can make observation of the dimmer luminosity very difficult. Luminance balance across visible colors is important to present an accurate representation of the real-world image. For example, if red is under-represented, stop lights may be difficult to interpret. Similarly, as mentioned above, color discrimination between roadway markings in white and in yellow can be difficult if there is not luminance balance across visible colors.

The classic answer to help solve color discrimination is to take the GRBG Bayer sensor, interpolate the missing colors through a demosaicking procedure (demosaicking is a digital image interpolation process that fills in the missing colors for each pixel used to reconstruct a full color image from the incomplete color samples output from an image sensor overlaid with a color filter array (CFA)), and then do an RGB to YUV (one luma component (Y) and two chrominance (UV) components) color space conversion, dropping the UV, and using the Y as the monochrome luminance. Demosaicking is also known as CFA interpolation or color reconstruction. Manufacturers of the RCCC pattern have claimed that one cannot achieve an acceptable monochrome conversion from the RCCC sensors.

Figure 1:
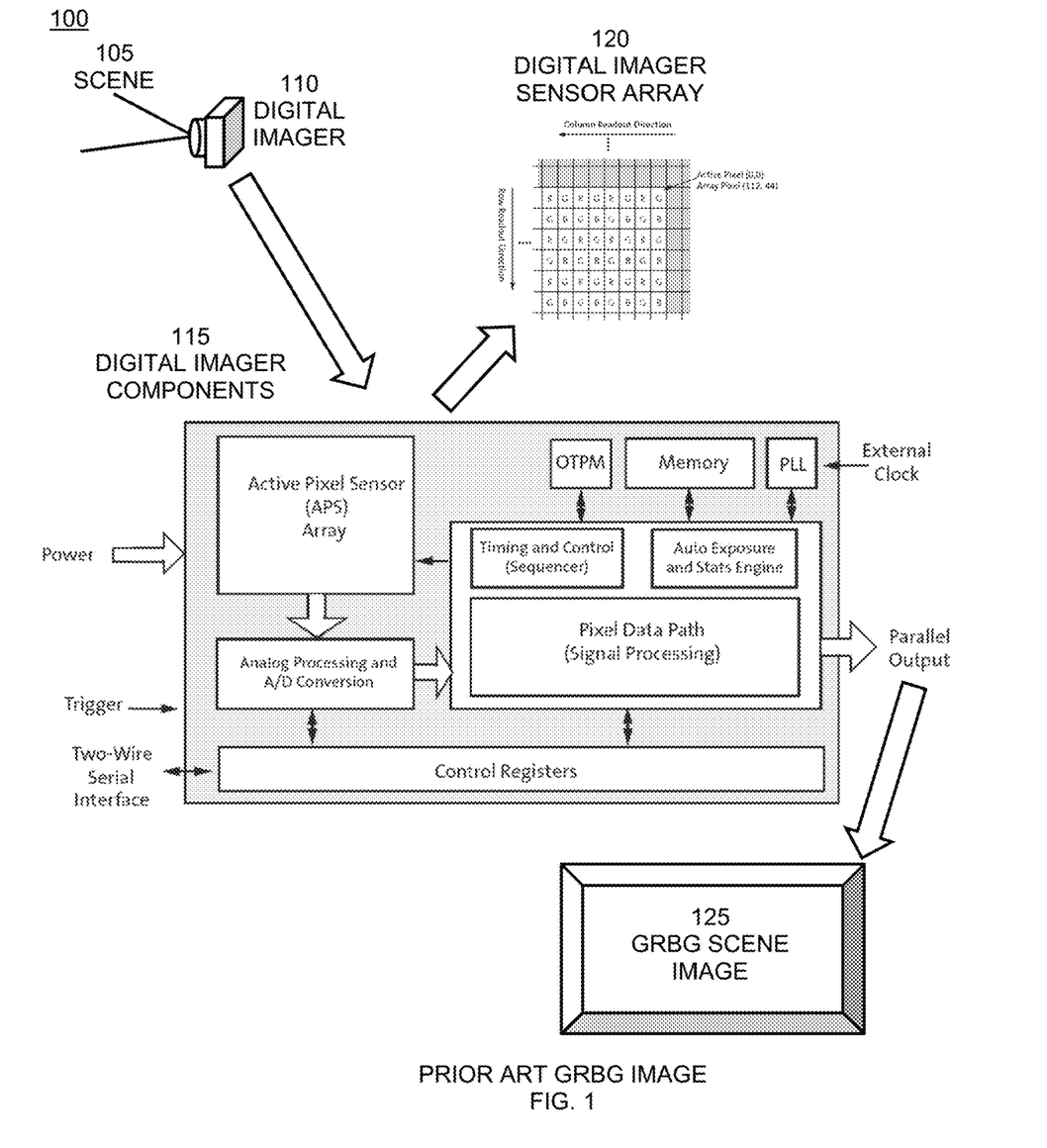
FIG. 1 depicts a prior art sensor system.

FIG. 1 depicts a prior art sensor system 100 for producing a monochrome image from a GRBG Bayer sensor. Depicted are a scene 105; digital imager 110 obtaining an image of scene 105; and digital imaging components 115 for processing image of scene 105 taken by digital imager 110. Included in components 115 is digital imager sensor array 120. Digital imager sensor array 120 comprises Bayer pattern Green-Red-Blue-Green (GRBG) pixels. Output 125 is derived from the GRBG pixels.

What is needed is a system, device, and method to produce a monochrome image from RCCC sensor image data that derives a good estimate of what the Red filtered pixels should be, while maintaining the highest detail possible, especially for low-light and very low-light environments.

SUMMARY

An embodiment provides a system for producing an interpolated monochrome image from a Red-Clear-Clear-Clear (RCCC) pattern image comprising an interpolation processing module comprising one or more processors for: receiving sampled, red filtered image pixels; interpolating a red plane using the sampled, red filtered image pixels, producing interpolated red pixels; subtracting the interpolated red pixels from sampled clear pixels, producing a Clear minus Red (C–R) plane; interpolating a C–R value for the sampled, red filtered image pixels; adding the C–R value to the sampled, red filtered image pixels; and outputting the monochrome image, wherein a luminance is substantially balanced across monochrome image pixels. In embodiments interpolating the red plane comprises selecting an interpolation method; selecting one of the sampled, red filtered image pixels; applying the selected interpolation method to the selected sampled, red filtered image pixels; applying the selected interpolation method to a next one of the red filtered pixels if not a last red filtered pixel, and if the last red filtered pixel, then ending the interpolating. In other embodiments, interpolating the red plane comprises selecting a C–R plane interpolation method; selecting one of the sampled, red filtered image pixels; applying the selected C–R plane interpolation method to the selected sampled, red filtered image pixels; applying the selected C–R plane interpolation method to a next one of the red filtered image pixels if not a last red filtered image pixel, and if the last red filtered image pixel, then end the interpolating, and output the C–R plane. In subsequent embodiments, for a selected one of the red filtered pixels, eight C–R values of pixels surrounding the selected one of the red filtered image pixels are used to interpolate a C–R value. For additional embodiments, applying the selected C–R plane interpolation method to the selected sampled, red filtered image pixels comprises averaging eight C–R values. In another embodiment, applying the selected C–R plane interpolation method to the selected sampled, red filtered image pixels comprises a weighted average where diagonal pixels which are further away from a central red pixel are weighted less than four nearest neighbors. For a following embodiment adding the interpolated C–R value to the sampled, red filtered image pixels produces an approximation of the sampled, red filtered image pixels would be if it were Clear. In subsequent embodiments an environment comprises a very low-light environment. In additional embodiments interpolation of the C–R value comprises a weighted average wherein diagonal pixels further away from a center red filtered image pixel are divided by a square root of two.

Another embodiment provides a method for producing an interpolated monochrome image from a Red-Clear-Clear-Clear (RCCC) pattern image comprising receiving sampled, red filtered image pixels comprising the RCCC pattern; interpolating a red plane using the sampled, red filtered image pixels, producing an interpolated red for at least some of the pixels; subtracting the interpolated red pixels from sampled clear pixels, producing a Clear minus Red (C–R) plane; interpolating a C–R value for the sampled, red filtered image pixels; adding the interpolated C–R value to the sampled, red filtered image pixel; and outputting the monochrome image, wherein a luminance is balanced across the monochrome image. In included embodiments the step of interpolating the red plane using the sampled, red filtered image pixels, producing the interpolated red for at least some of the pixels comprises a bicubic interpolator. In yet further embodiments, interpolating the red plane using the sampled, red filtered image pixels, producing the interpolated red for at least some of the pixels comprises a gradient descent method. In related embodiments interpolating the red plane using the sampled, red filtered image pixels, producing the interpolated red for at least some of the pixels comprises an edge-preserving pattern recognition method. For further embodiments, interpolating the red plane using the sampled, red filtered image pixels, producing the interpolated red for at least some of the pixels comprises an estimator. In ensuing embodiments, interpolating the red plane using the sampled, red image filtered pixels comprises a bilinear filter. For yet further embodiments, interpolating the red plane using the sampled, red filtered image pixels, producing the interpolated red for at least some of the pixel comprises selecting an interpolation method; selecting a sampled, red filtered pixel from the sampled, red filtered image pixels; applying the selected interpolation method to the selected sampled, red filtered pixel; applying the selected interpolation method to the next red filtered pixel if not a last red filtered pixel, and if a last red filtered pixel, then ending interpolating. For more embodiments, interpolating the C–R value for the selected, red filtered image pixels comprises: selecting a C–R plane interpolation method; selecting a sampled, red filtered pixel from the sampled, red filtered image pixels; applying the selected C–R plane interpolation method to the selected sampled, red filtered pixel; applying the selected C–R plane interpolation method to the next red filtered pixel if not a last red filtered pixel, and if a last red filtered pixel, then ending interpolating, and outputting the C–R plane. Continued embodiments include applying the selected C–R plane interpolation method to the selected sampled, red filtered pixel comprises one of averaging eight C–R values; and a weighted average where diagonal pixels which are further away from a center red pixel are weighted less than four nearest neighbors. For additional embodiments, adding the interpolated C–R value to the sampled red pixels produces an approximation of the sampled, red filtered image pixels as they would be if they were Clear.

A yet further embodiment provides a computer program product including one or more non-transitory machine-readable mediums encoding instructions that when executed by one or more processors cause a process to be carried out for producing an interpolated monochrome image from a Red-Clear-Clear-Clear (RCCC) pattern image, the process comprising receiving sampled, red filtered image pixels comprising the RCCC pattern image; interpolating a red plane using the sampled, red filtered image pixels, producing interpolated red pixels; subtracting the interpolated red pixels from sampled clear pixels, producing a Clear minus Red (C–R) plane; interpolating C–R value for the red filtered image pixels; adding the interpolated C–R value to the sampled, red filtered image pixels; and outputting the interpolated monochrome image, wherein a luminance is balanced across the monochrome image pixels.

These and other features of the present embodiments will be understood better by reading the following detailed description, taken together with the figures herein described.

The accompanying drawings are not intended to be drawn to scale. For purposes of clarity, not every component may be labeled in every drawing.

DETAILED DESCRIPTION

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The invention is susceptible of many embodiments. What follows is illustrative, but not exhaustive, of the scope of the invention.

Embodiments use fidelity in the densely sampled clear plane, to derive a good estimate of what the Red filtered pixels should be, while maintaining the highest detail possible, and doing the least aggressive filtration. Embodiments start by doing an interpolation of the Red plane using the known, sampled, Red filtered pixels, producing an interpolated Red for every pixel. Example interpolation methods include a bilinear filter. Other examples comprise a bicubic interpolator, a gradient descent method, an edge-preserving pattern recognition method, or an estimator. The interpolated Red pixels are subtracted from the sampled Clear pixels to obtain a "Clear minus Red" ("C–R") plane. Each, actually sampled, Red filtered pixel is surrounded by eight of the actually sampled Clear minus interpolated Red pixels. For each red filtered pixel, the eight C–R values are used to interpolate the C–R value for that pixel. In embodiments, this is done by averaging the eight C–R values, or by doing a weighted average where the diagonal pixels which are further away from the center Red pixel is weighted less than the four nearest neighbors. Lastly, this interpolated C–R value is added to the existing sampled red pixel to obtain an excellent approximation of what the unfiltered Red pixel would be if it were Clear. This is used for the monochrome image.

Figure 2:
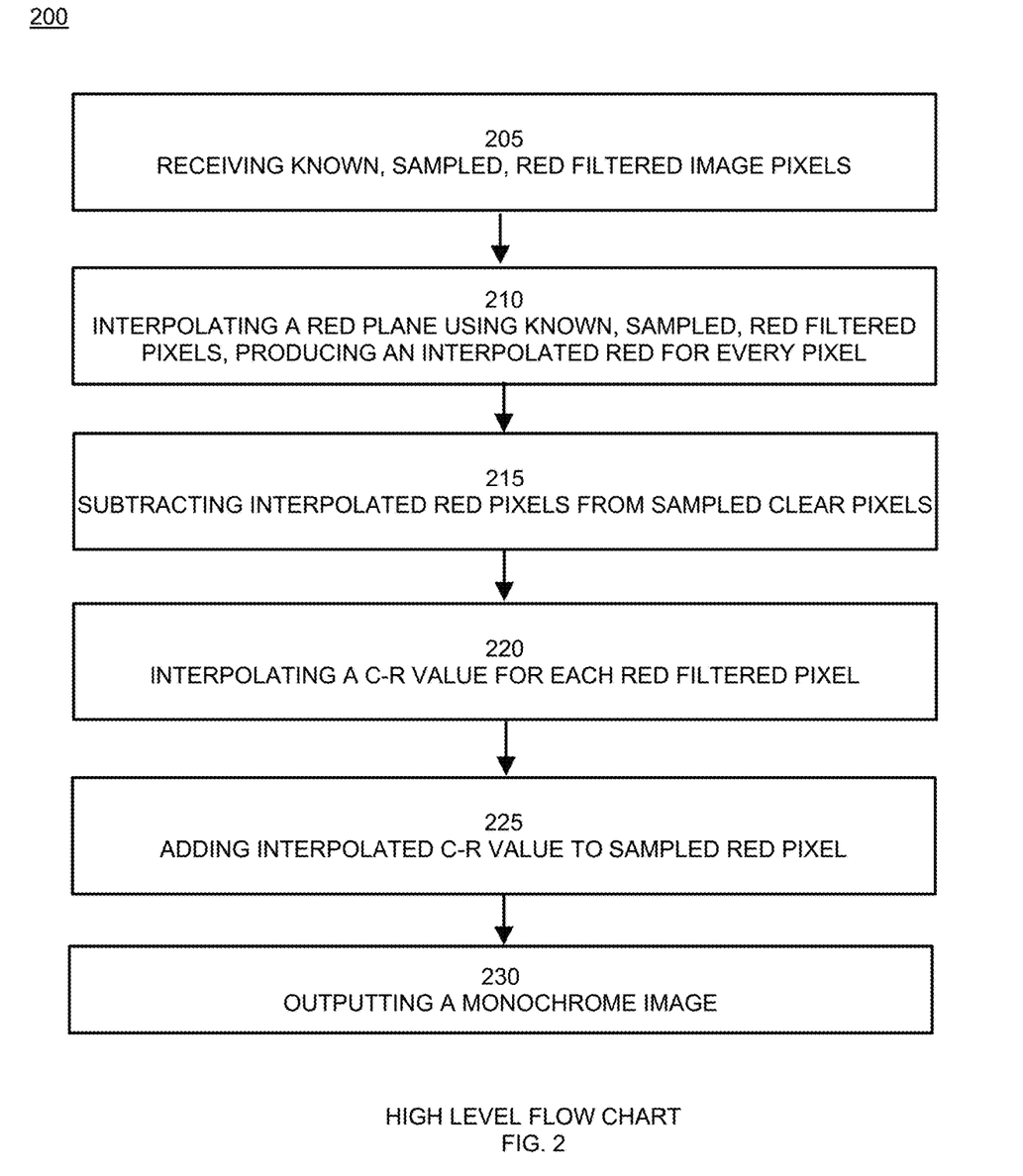
FIG. 2 depicts a high level flow chart for a method configured in accordance with an embodiment.

FIG. 2 is a high level flow chart 200 of a first embodiment. Steps comprise: receiving known, sampled, red filtered image pixels from an imager having a RCCC pattern filter array 205; interpolating a red plane using the known, sampled, red filtered pixels 210; subtracting the interpolated red pixels from sampled clear pixels 215, producing a "Clear minus Red" ("C–R") plane; interpolating a C–R value for each red filtered pixel 220; adding the interpolated C–R value to the sampled red pixel 225; and outputting the interpolated monochrome image 230.

Figure 3:
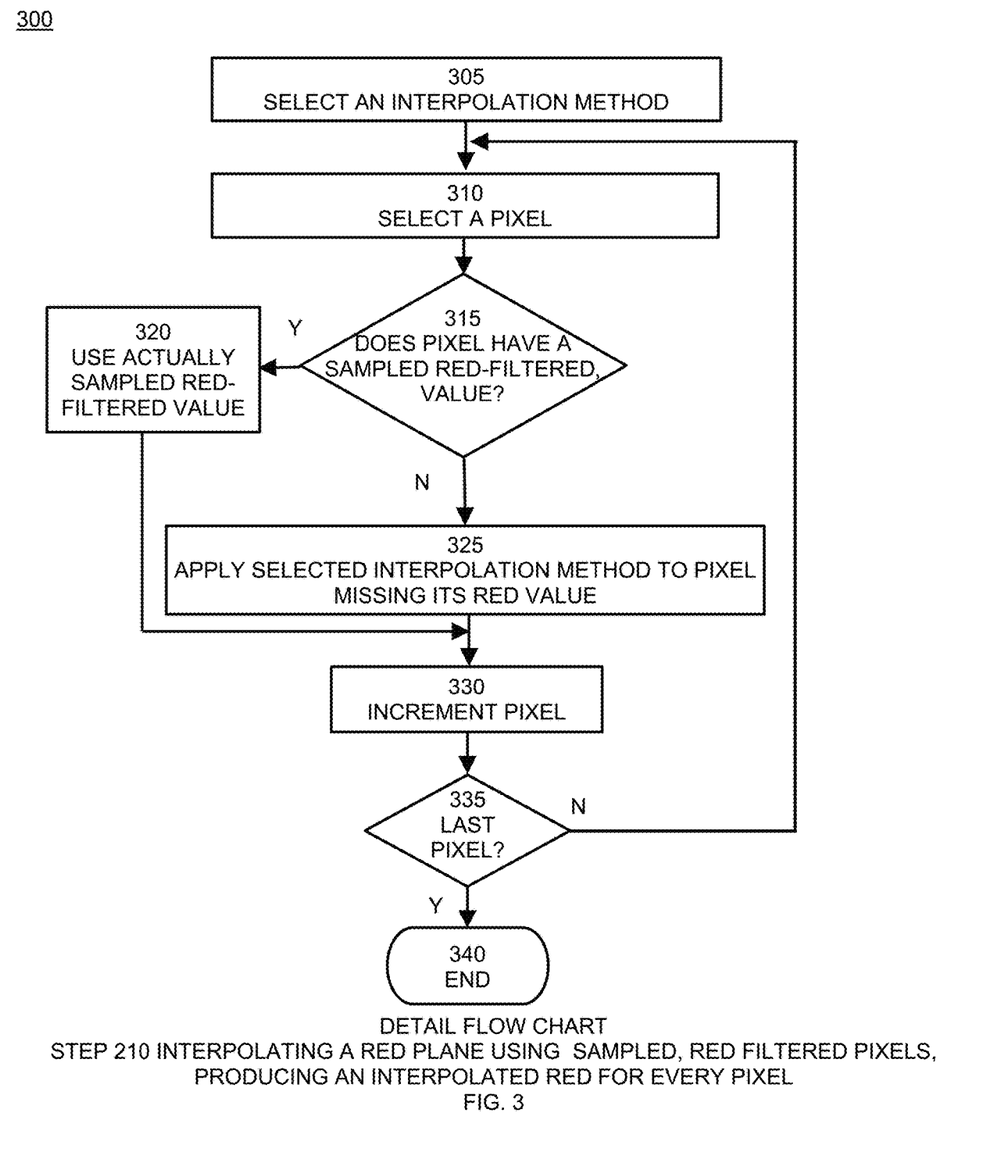
FIG. 3 is a detail flow chart for a method configured in accordance with an embodiment.

FIG. 3 is a detail flow chart 300 for step 210. Steps to interpolate the red plane use the sampled, red filtered, pixels, producing an interpolated red for every pixel. Steps comprise selecting an interpolation method 305. Example interpolation methods comprise a bilinear filter, a bicubic interpolator, a gradient descent method, an edge-preserving pattern recognition method, or an estimator. Next, a pixel is selected 310; if the pixel has a sampled red-filtered value 315, then that actually sampled red value is used 320. Otherwise, apply selected interpolation method to the pixel which is missing its red value 325. The pixel is incremented 330, and the next one is interpolated—if last pixel 335, interpolation ends 340. Embodiments use the sampled red pixels as-is, the selected interpolation method is applied to the non-red-filtered pixels, and the embodiment uses the red-filtered pixels to estimate the missing red values.

Figure 4:
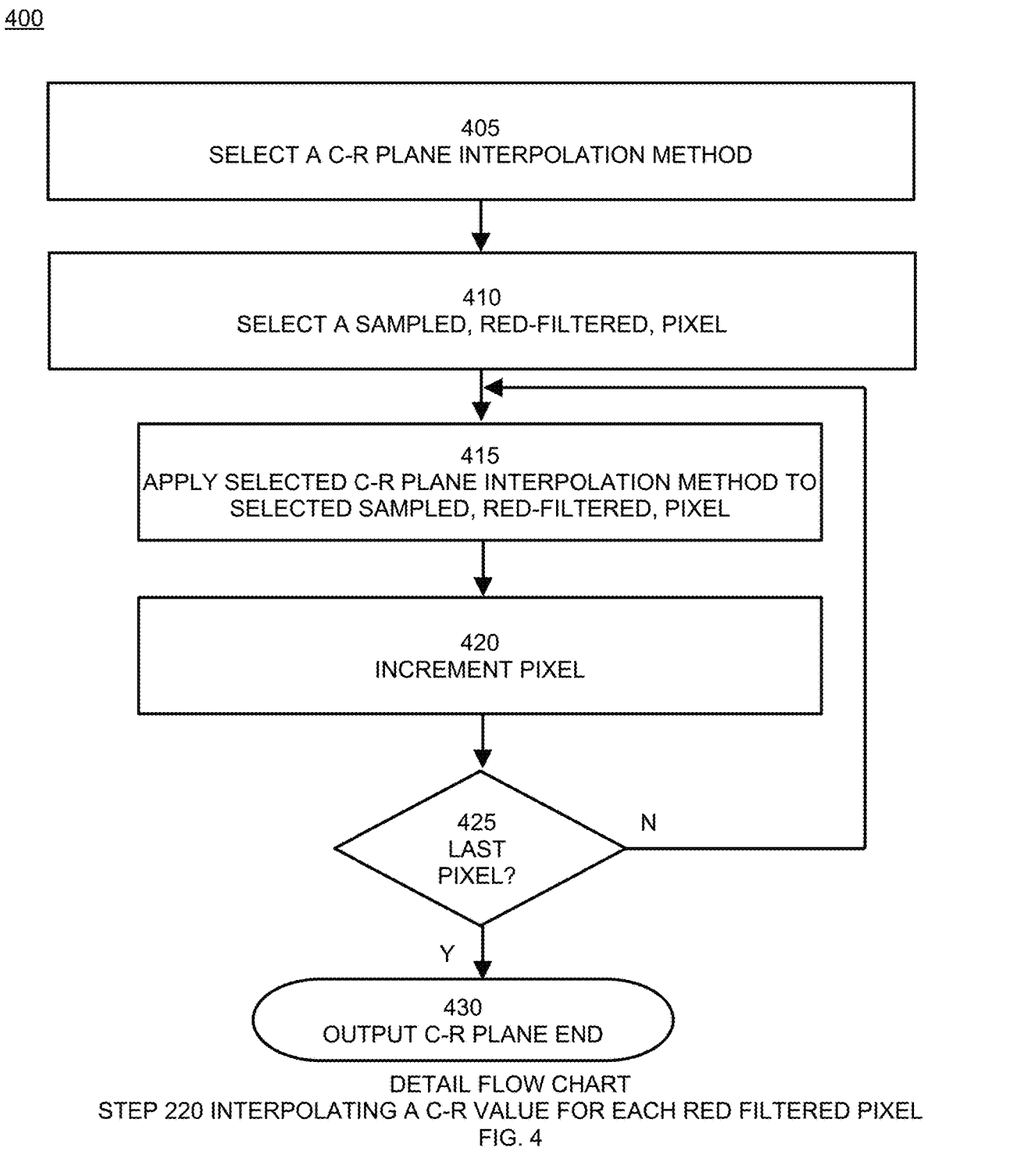
FIG. 4 is a detail flow chart for a method configured in accordance with an embodiment.

FIG. 4 is a detail flow chart 400 for step 220 to produce a "Clear minus Red" ("C−R") plane. Each, actually sampled, red filtered pixel is surrounded by eight of the actually sampled Clear minus interpolated red pixels. For each Red filtered pixel, the eight C−R values are used to interpolate the C−R value for that pixel. First, a C−R plane interpolation method is selected 405. In embodiments, this is done by averaging the eight C−R values, or by doing a weighted average where the diagonal pixels which are further away from the center red pixel is weighted less than the four nearest neighbors. Next, a sampled, red filtered pixel is selected 410; and the selected C−R plane interpolation method is applied to the selected sampled, red filtered pixel to obtain a C−R value for that red filtered pixel location 415. The pixel is incremented 420, and the next one is interpolated—if last pixel 425, interpolation ends and the C−R plane is output 430.

Figure 5:
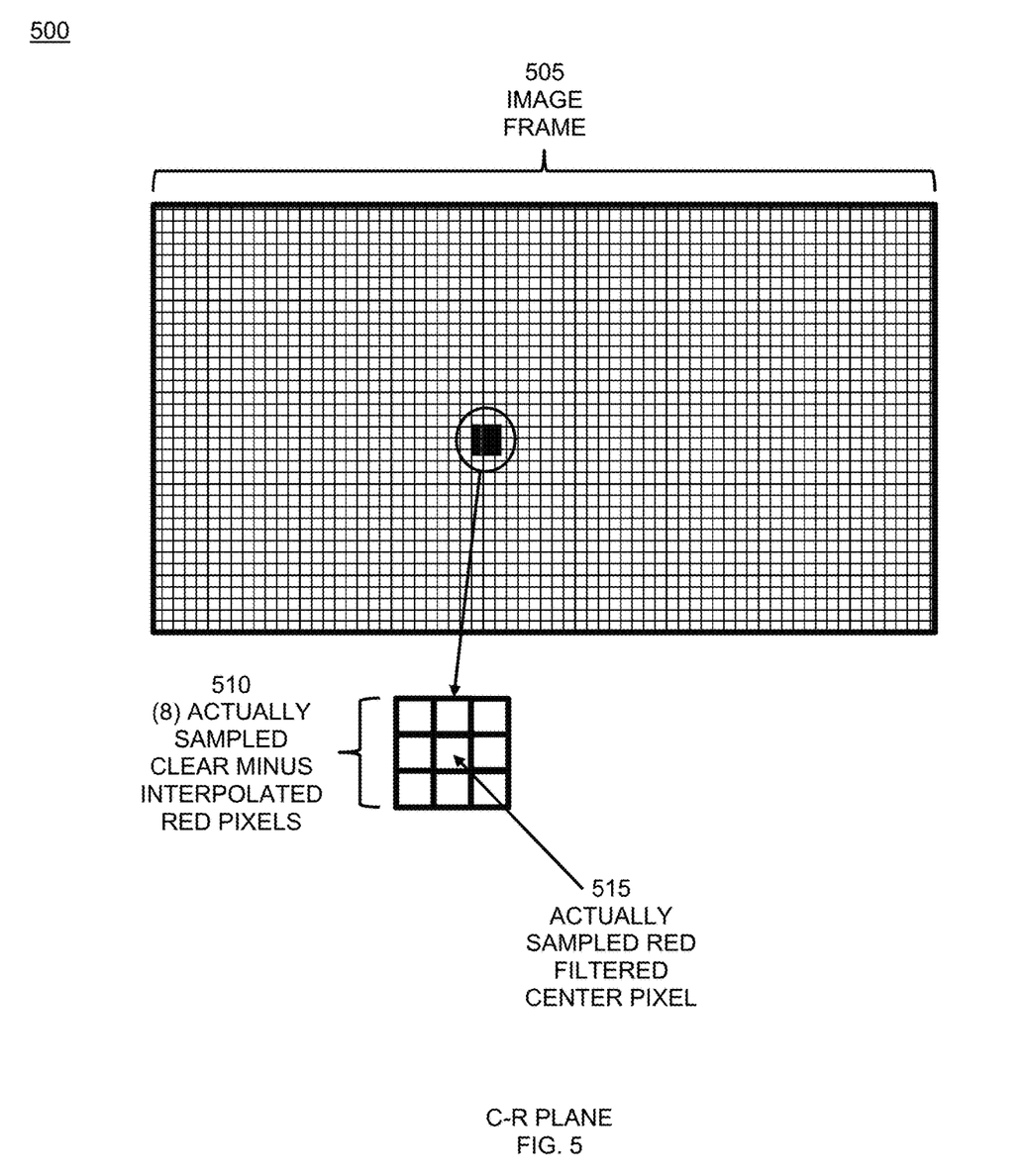
FIG. 5 depicts an image frame 3×3 kernel configured in accordance with an embodiment.

FIG. 5 depicts an image frame 3×3 kernel of the C−R plane used to interpolate a C−R value for each red filtered pixel. Image frame 505 comprises 3×3 kernels comprising eight pixels 510 surrounding the actually sampled red filtered center pixel 515.

In contrast with previous methods, the embodiment methods are better than the previous methods of demosaicking a GRBG array, and then doing the YUV conversion. This is because the classic method starts with cutting down the sensitivity of the photodiode in the first place. It then uses finite math and rounding further introducing noise in the final Y value. Every single pixel has a color filter of some type which cuts down the transmissivity and throws away ⅔rds of the information present. The previous method then interpolates, and then does three multiplies and two additions, introducing further rounding errors in every pixel. Embodiments of the RCCC to Monochrome Interpolator described above starts by keeping the full information of 3 out of 4 pixels, with no filtration at all, and then for the 1 out of 4 pixels where roughly ⅔rds of the information was thrown out by using a red filter, that information is recreated using the full information of the eight, full spectrum neighbors. Embodiments of this method are also much better than just omitting the sampled red pixels, and simply averaging the Clear neighbors for the red pixel replacement, equivalent to a low-pass filter. Embodiments do much better in keeping the fidelity of the original image.

Embodiments provide a kernel for an excellent monochrome version of an image sensor with an RCCC CFA. Embodiments produce a good "C" equivalent for the "R"-covered pixels without losing too much sharpness and smearing across a large kernel with something like a heavy-handed filter that just averages the eight C neighbors and throws away the R information. Embodiments calculate color differences in planes with high fidelity (the C-plane in this case), to come up with a better estimate for the missing information. These embodiments can be considered as first doing an interpolation of the "R" plane. Embodiment interpolation examples comprise bi-cubic, a gradient descent, an edge-preserving pattern recognition, or another reasonable interpolation. Examples use a bilinear filter for simplicity. Next, subtract the interpolated R's from each real, sampled C to get a "C−R" plane. For each sampled "R" that is to be replaced with a good estimation of its "C" value, take all eight of its "C−R" neighbors just calculated (embodiments can weight them by dividing the diagonal contributors that are further away by SQRT(2) to provide more accuracy and remain less heavy-handed in filtering) and finally, add back-in the real, sampled, "R" to it's interpolated (C−R) value.

The array below provides a long-handed version of the above.

$$R(-2,-2) \quad C(-1,-2) \quad R(0,-2) \quad C(+1,-2) \quad R(+2,-2)$$
$$C(-2,-1) \quad C(-1,-1) \quad C(0,-1) \quad C(+1,-1) \quad C(+2,-1)$$
$$R(-2,0) \quad C(-1,0) \quad R(0,0) \quad C(+1,0) \quad R(+2,0)$$
$$C(-2,+1) \quad C(-1,+1) \quad C(0,+1) \quad C(+1,+1) \quad C(+2,+1)$$
$$R(-2,+2) \quad C(-1,+2) \quad R(0,+2) \quad C(+1,+2) \quad R(+2,+2)$$

and $$C - R(0,0) =$$
$$((C(0,-1) - (R(0,-2) + R(0,0))/2 + C(+1,0) - (R(+2,0) + R(0,0))/$$
$$2 + C(0,+1) - (R(0,+2) + R(0,0))/2 +$$
$$C(-1,0) - (R(-2,0) + R(0,0))/2) + (C(-1,-1) -$$
$$(R(-2,0) + R(-2,-2) + R(0,-2) + R(0,0))/4 + C(+1,-1) -$$
$$(R(0,-2) + R(+2,-2) + R(+2,0) + (0,0))/4 + C(+1,+1) -$$
$$(R(+2,0) + R(+2,+2) + R(0,+2) + R(0,0))/4 + C(-1,+1) -$$
$$(R(0,+2) + R(-2,+2) + R(-2,0) + R(0,0))/4)/SQRT(2))/$$

$$(4 + (4/SQRT(2)) \text{ (this last term normalizes the sum)}$$

Now: C(0, 0)=C−R(0, 0)+R(0, 0) (This adds some real, actually sampled R fidelity back in.)

The basic idea conveyed from above is to accomplish an interpolation of R's; use this interpolation to find a color difference plane (C−R); interpolate the C−R(0,0) value of interest; and use C−R(0,0)+R(0,0) as the new C(0,0). This keeps the exactly sampled values for ⅝'s of the 3×3 kernel. The ⅛ center C(0,0) pixel in the above example, is the only one that is really interpolated.

Considering the basic 2×2 pixel array (RCCC), 3 out of 4 pixels are the full spectrum, sampled clear value. 1 out of 4 has roughly ⅔rd of its spectrum discarded, meaning 10/12th or ⅚th of the original data is kept, interpolating ⅙th of the data in the scene. The above example does a good job of estimating the last ⅔rd of the energy in the red filtered pixel that had been discarded.

In contrast, if starting with RGB, there is only 9/27th of actually sampled data. 18/27th of the information is interpolated, however demosaicking is implemented. This is then pushed through a YUV color space conversion, throwing out the UV, and returning the Y for the monochrome estimate. This is AFTER the QE curve has been degraded the by passing it through an RGB CFA.

Given the dominance of this type of color filter array in the automotive arena and the need for monochrome images, embodiments have applications in the automotive space. Embodiments are generalized to similar situations with non-standard color filter arrays. Embodiments can be used with a sparse green array.

Embodiments provide the best results for the lowest light situations. "Very low-light" is in the range of 0.005 Lux to 0.05 Lux; a "low-light" environment is in the range of 0.01 Lux to 0.10 Lux. For reference, 0.01 Lux is equivalent to a quarter-moon, and 0.25 Lux for a full moon. An example device for maximum low light, monochrome, performance is the ON Semiconductor® AR0138 CMOS image sensor in an RCCC configuration.

The computing system used for the production of an interpolated monochrome image from a Red-Clear-Clear-Clear (RCCC) pattern images for performing (or controlling) the operations or functions described hereinabove with respect to the system and/or the method may include a processor, FPGA, I/O devices, a memory system, and a network adaptor. The computing system includes a program module (not shown) for performing (or controlling) the operations or functions described hereinabove with respect to the system and/or the method according to exemplary embodiments. For example, the program module may include routines, programs, objects, components, logic, data structures, or the like, for performing particular tasks or implement particular abstract data types. The processor may execute instructions written in the program module to perform (or control) the operations or functions described hereinabove with respect to the system and/or the method. The program module may be programmed into the integrated circuits of the processor. In an exemplary embodiment, the program module may be stored in the memory system or in a remote computer system storage media.

The computing system may include a variety of computing system readable media. Such media may be any available media that is accessible by the computer system, and it may include both volatile and non-volatile media, removable and non-removable media.

The memory system can include computer system readable media in the form of volatile memory, such as random access memory (RAM) and/or cache memory or others. The computer system may further include other removable/non-removable, volatile/non-volatile computer system storage media. The computer system can communicate with one or more devices using the network adapter. The network adapter may support wired communications based on Internet, LAN, WAN, or the like, or wireless communications based on CDMA, GSM, wideband CDMA, CDMA-2000, TDMA, LTE, wireless LAN, Bluetooth, or the like.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++ or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to a flowchart illustration and/or block diagram of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The foregoing description of the embodiments has been presented for the purposes of illustration and description. It is not intended to be exhaustive or to limit the invention to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. A system for producing an interpolated monochrome image from a Red-Clear-Clear-Clear (RCCC) pattern image comprising:
   an interpolation processing module comprising one or more processors for:
   receiving sampled, red filtered image pixels;
   interpolating a red plane using said sampled, red filtered image pixels, producing interpolated red pixels;
   subtracting said interpolated red pixels from sampled clear pixels, producing a Clear minus Red (C-R) plane;
   interpolating a C-R value for each of said sampled, red filtered image pixels;
   adding said C-R value to each of said sampled, red filtered image pixels; and
   outputting said monochrome image, wherein a luminance is balanced across monochrome image pixels.

2. The system of claim 1 wherein interpolating said red plane comprises:
   selecting an interpolation method;
   selecting one of said sampled, red filtered image pixels;
   applying said selected interpolation method to said selected one of said sampled, red filtered image pixels;
   selecting a next one of said sampled, red filtered image pixels;
   applying said selected interpolation method to said next one of said red filtered pixels and if said next one of said red filtered pixels is said last red filtered pixel, then ending said interpolating.

3. The system of claim 1 wherein said interpolating said red plane comprises:
   selecting a C-R plane interpolation method;
   selecting one of said sampled, red filtered image pixels;
   applying said selected C-R plane interpolation method to said selected one of said sampled, red filtered image pixels;
   selecting a next one of said sampled, red filtered image pixels;
   applying said selected C-R plane interpolation method to said next one of said sampled, red filtered image pixels and if said next one of said sampled, red filtered pixels is said last red filtered image pixel, then end said interpolating, and output said C-R plane.

4. The system of claim 1 wherein, for a selected one of said red filtered pixels, eight C-R values of pixels surrounding said selected one of said red filtered image pixels are used to interpolate said C-R value for each of said sampled, red filtered image pixels.

5. The system of claim 3 wherein applying said selected C-R plane interpolation method to said selected sampled, red filtered image pixels comprises:
   averaging eight C-R values of pixels surrounding said selected one of said sampled, red filtered image pixels.

6. The system of claim 3 wherein applying said selected C-R plane interpolation method to said selected sampled, red filtered image pixels comprises:
   a weighted average of said eight C-R values of pixels wherein diagonal pixels which are further away from a central red pixel of said selected one of said sampled, red filtered image pixels are weighted less than four nearest neighbors from said central red pixel of said selected one of said sampled, red filtered image pixels.

7. The system of claim 1 wherein adding said interpolated C-R value to said sampled, red filtered image pixels produces an approximation of said sampled, red filtered image pixels would be if said sampled, red filtered image pixels were Clear.

8. The system of claim 1 further comprising a digital imager obtaining an image that provides the sampled, red filtered image pixels, wherein the image is taken in an environment that comprises a very low-light environment.

9. The system of claim 1 wherein interpolation of said C-R value comprises:
   a weighted average of said eight C-R values of pixels wherein diagonal pixels further away from a center red filtered image pixel of said selected one of said sampled, red filtered image pixels are divided by a square root of two.

10. A method for producing an interpolated monochrome image from a Red-Clear-Clear-Clear (RCCC) pattern image comprising:
    receiving sampled, red filtered image pixels comprising said RCCC pattern;
    interpolating a red plane using said sampled, red filtered image pixels, producing an interpolated red plane for at least some of the pixels;
    subtracting said interpolated red pixels from sampled clear pixels, producing a Clear minus Red (C−R) plane;
    interpolating a C−R value for each of said sampled, red filtered image pixels;
    adding said interpolated C−R value to said sampled, red filtered image pixels; and
    outputting said monochrome image, wherein a luminance is balanced across said monochrome image.

11. The method of claim 10 wherein said step of interpolating said red plane using said sampled, red filtered image pixels, producing said interpolated red plane for at least some of said pixels comprises:
    a bicubic interpolator.

12. The method of claim 10 wherein said step of interpolating the red plane using said sampled, red filtered image pixels, producing said interpolated red plane for at least some of said pixels comprises:
    a gradient descent method.

13. The method of claim 10 wherein said step of interpolating said red plane using said sampled, red filtered image pixels, producing said interpolated red plane for at least some of said pixels comprises:
    an edge-preserving pattern recognition method.

14. The method of claim 10 wherein said step of interpolating said red plane using said sampled, red filtered image pixels, producing said interpolated red plane for at least some of said pixels comprises:
    an estimator.

15. The method of claim 10 wherein said step of interpolating said red plane using said sampled, red image filtered pixels comprises a bilinear filter.

16. The method of claim 10 wherein said step of interpolating said red plane using said sampled, red filtered image pixels, producing said interpolated red plane for at least some of said pixel comprises:
    selecting an interpolation method;
    selecting a sampled, red filtered pixel from said sampled, red filtered image pixels;
    applying said selected interpolation method to said selected sampled, red filtered pixel;
    selecting a next one of said sampled, red filtered image pixels;
    applying said selected interpolation method to said next one of said red filtered pixel and if said next one of said red filtered pixels is said last red filtered pixel, then ending interpolating.

17. The method of claim 10 wherein said interpolating the C−R value for said selected, red filtered image pixels comprises:
    selecting a C−R plane interpolation method;
    selecting a sampled, red filtered pixel from said sampled, red filtered image pixels;
    applying said selected C−R plane interpolation method to said selected sampled, red filtered pixel;
    selecting a next one of said sampled, red filtered image pixels;
    applying said selected C−R plane interpolation method to said next red filtered pixel and if said next one of said red filtered pixels is a last red filtered pixel, then ending interpolating, and outputting said C−R plane.

18. The method of claim 17 wherein applying said selected C−R plane interpolation method to said selected sampled, red filtered pixel comprises one of:
    averaging eight C R; values of pixels surrounding said selected one of the red filtered image pixels; and
    a weighted average of said eight C−R values of pixels wherein diagonal pixels which are further away from a center red pixel of said selected one of said sampled, red filtered image pixels are weighted less than four nearest neighbors from said central red pixel of said selected one of said sampled, red filtered image pixels.

19. The method of claim 10 wherein adding said interpolated C−R value to said sampled red pixels produces an approximation of said sampled, red filtered image pixels as they would be if said sampled, red filtered image pixels were Clear.

20. A computer program product including one or more non-transitory machine-readable mediums encoding instructions that when executed by one or more processors cause a process to be carried out for producing an interpolated monochrome image from a Red-Clear-Clear-Clear (RCCC) pattern image, the process comprising:
    receiving sampled, red filtered image pixels comprising said RCCC pattern image;
    interpolating a red plane using said sampled, red filtered image pixels, producing interpolated red pixels;
    subtracting said interpolated red pixels from sampled clear pixels, producing a Clear minus Red (C−R) plane;
    interpolating C−R value for each of said red filtered image pixels;
    adding said interpolated C−R value to said sampled, red filtered image pixels; and
    outputting said interpolated monochrome image, wherein a luminance is balanced across said monochrome image pixels.

* * * * *